(12) United States Patent
Parent et al.

(10) Patent No.: US 7,873,091 B2
(45) Date of Patent: Jan. 18, 2011

(54) LASER DIODE ILLUMINATOR DEVICE AND METHOD FOR OPTICALLY CONDITIONING THE LIGHT BEAM EMITTED BY THE SAME

(75) Inventors: André Parent, Quebec (CA); Paul Grenier, Quebec (CA); Yves Taillon, Saint-Augustin-de-Desmaures (CA); Bruno Labranche, Quebec (CA)

(73) Assignee: Institut National D'Optique, Sainte-Foy, Quebec (CA)

( * ) Notice: Subject to any disclaimer, the term of this patent is extended or adjusted under 35 U.S.C. 154(b) by 0 days.

(21) Appl. No.: 12/401,402

(22) Filed: Mar. 10, 2009

(65) Prior Publication Data

US 2010/0040098 A1    Feb. 18, 2010

Related U.S. Application Data

(60) Provisional application No. 61/088,507, filed on Aug. 13, 2008.

(51) Int. Cl.
  *H01S 5/00*        (2006.01)
(52) U.S. Cl. .................. 372/50.12; 372/36; 372/50.23; 372/98; 372/101; 372/107; 372/108; 359/641; 359/871
(58) Field of Classification Search .................. 372/36, 372/50.12, 50.23, 98, 101, 107, 108; 359/641, 359/871
See application file for complete search history.

(56) References Cited

U.S. PATENT DOCUMENTS

| | | | |
|---|---|---|---|
| 4,716,568 A | 12/1987 | Scifres et al. |
| 4,719,631 A | 1/1988 | Conaway |
| 4,785,459 A | 11/1988 | Baer |
| 5,040,187 A | 8/1991 | Karpinski |
| 5,081,639 A | 1/1992 | Snyder et al. |
| 5,099,488 A | 3/1992 | Ahrabi et al. |
| 5,128,951 A | 7/1992 | Karpinski |
| 5,168,401 A | 12/1992 | Endriz |

(Continued)

OTHER PUBLICATIONS

Way et al. "Beam Shaping Laser Diode Array Output for Optical Pumping and Illumination." *Aerospace Conference Proceedings*, vol. 3, Mar. 2000, pp. 61-65.

*Primary Examiner*—Tod T Van Roy
*Assistant Examiner*—Yuanda Zhang
(74) *Attorney, Agent, or Firm*—Merchant & Gould P.C.

(57) ABSTRACT

A laser diode illuminator device and a method for optically conditioning the output beam radiated from such a device, so that highly-demanding illumination application requirements that call for high output powers within a specified field of illumination can be addressed. At the heart of the device is a two-dimensional stack of laser diode bars wherein the linear array of beamlets radiated by each laser diode bar is optically conditioned through its passage in a refractive-type micro-optics device followed by a cylindrical microlens. The micro-optics device performs collimation of the linear array of beamlets along the fast axis of the bars, and it also acts as a beam symmetrization device by interchanging the divergences of the laser beamlets along the fast and slow axes. The cylindrical microlens is for collimation of the beamlets along the slow axis. The optical conditioning is performed individually for each linear array of beamlets so that the radiance or brightness of the laser diode illuminator can be optimized while any specified field of illumination can be filled with an excellent uniformity of the radiant intensity.

7 Claims, 8 Drawing Sheets

U.S. PATENT DOCUMENTS

| | | |
|---|---|---|
| 5,284,790 A | 2/1994 | Karpinski |
| 5,305,344 A | 4/1994 | Patel |
| 5,311,530 A | 5/1994 | Wagner et al. |
| 5,311,535 A | 5/1994 | Karpinski |
| 5,513,201 A | 4/1996 | Yamaguchi et al. |
| 5,715,264 A | 2/1998 | Patel et al. |
| 5,764,675 A | 6/1998 | Juhala |
| 5,825,803 A | 10/1998 | Labranche et al. |
| 6,272,164 B1 * | 8/2001 | McMinn et al. .......... 372/50.12 |
| 6,324,190 B1 | 11/2001 | Du et al. |
| 6,471,372 B1 | 10/2002 | Lissotschenko et al. |
| 6,639,727 B2 | 10/2003 | Kusuyama |
| 6,870,682 B1 | 3/2005 | Grenier et al. |
| 7,027,228 B2 | 4/2006 | Mikhailov |
| 7,079,566 B2 * | 7/2006 | Kido et al. .................. 372/101 |
| 7,230,968 B2 * | 6/2007 | Imai et al. ................... 372/101 |
| 7,260,131 B2 | 8/2007 | Grenier et al. |
| 7,653,115 B2 * | 1/2010 | Yamaguchi et al. ......... 372/101 |
| 2004/0091013 A1 * | 5/2004 | Yamaguchi et al. ......... 372/108 |
| 2005/0063435 A1 * | 3/2005 | Imai et al. ..................... 372/43 |
| 2006/0159147 A1 * | 7/2006 | Grenier et al. ............ 372/50.12 |
| 2008/0101429 A1 * | 5/2008 | Sipes ...................... 372/50.12 |

* cited by examiner

LASER DIODE ILLUMINATOR DEVICE AND METHOD FOR OPTICALLY CONDITIONING THE LIGHT BEAM EMITTED BY THE SAME

This application claims benefit of U.S. 61/088,507, filed Aug. 13, 2008, and which application is incorporated herein by reference. To the extent appropriate, a claim of priority is made to the above disclosed application.

FIELD OF THE INVENTION

The present invention relates to a laser illuminator device, and more particularly to an illuminator device comprising an optical source made up of a plurality of laser diode bars, the array of beamlets radiated by each laser diode bar being optically conditioned by micro-optics components having their characteristics and positionings optimized for the intended application.

BACKGROUND OF THE INVENTION

Laser illuminators are a class of light illumination systems in which at least one laser device acts as the source of optical radiation. These illuminator devices are generally more complex and less affordable than their more conventional counterparts that make use of nonlaser optical sources. Laser illuminators then find their best use in niche applications that call for highly-demanding illumination characteristics. For example, combining a laser illuminator to a low-light-level imager, either intensified or not, results in an active night-vision system that enables viewing of scenes in full darkness. Non-emissive objects located at distances that can attain a few kilometers can be illuminated and then reliably detected. Active night-vision systems find their way in both military (visual reconnaissance, surveillance, sniper detection, search-and-rescue operations) and civilian applications (surveillance, evidence gathering, law enforcement, identification of vehicles). The key illumination parameters vary with the intended application, but they relate generally to the radiated laser power, the field of illumination (related to the beam divergence, or angular spreading), which determines the size of the illuminated area at a given distance, and the uniformity of the radiant intensity (power per unit solid angle) within the field of illumination.

As compared to their nonlaser counterparts, several types of laser sources are well suited for use in light illuminators. This is due to some distinctive properties such as their unsurpassed radiance (power per unit area and unit solid angle), the excellent spatial quality of their raw laser output beams, their ability to operate in repetitively-pulsed regime with pulse durations as short as a few nanoseconds, and their nearly monochromatic emission spectrum. This latter property enables efficient rejection of the parasitic background light through the use of a matched narrowband optical filter inserted in front of the low-light-level imager. Laser sources are available with emission wavelengths that now cover a wide portion of the electromagnetic spectrum from the ultraviolet to the mid-infrared. For instance, laser illuminators that radiate near-infrared light invisible to the unaided eye can be built for applications in which covertness is a premium while maintaining an excellent image resolution. Accordingly, the laser emission wavelength can be selected to closely match the peak of the spectral responsivity figure of the low-light-level image sensor, thus providing optimum detection sensitivity. Finally, lasers emitting at wavelengths above 1400 nm (nanometers) out of the retinal hazard region can be integrated in illuminators that are required to be safe in case of inadvertent ocular exposure to the laser radiation.

High-power semiconductor lasers in the form of monolithic linear arrays of several laser diode emitters grown on a common substrate are recognized as the most popular optical sources for use in laser illuminators. These laser devices, generally known as either laser diode arrays or laser diode bars, have a high electrical-to-optical conversion efficiency while their rated lifetimes typically exceed several thousand hours. In addition, their very small size allows them to be packaged in the form of rugged and very compact laser modules. By way of example, FIG. 1 (PRIOR ART) shows a schematic perspective view of a laser diode bar comprising eight individual emitters having their front facets (radiating output apertures) depicted by the hatched rectangular areas. Note, however, that real laser diode bars may comprise from 10 to 80 individual emitters. The laser emitters are equally spaced from each other, and they spread along the X axis, parallel to their semiconductor PN junctions. The width W of each individual emitter along the X axis is typically in the range of 50 μm to 200 μm (micrometers), while the center-to-center spacing S (also referred to as the emitter pitch) is such that the ratio W/S varies from about 20% to 80%. This ratio is often denoted as the fill factor of the laser diode bars. The full width of a laser diode bar is generally set to the 10 mm standard. Nowadays, properly cooled laser diode bars driven with injection currents of several tens of Amperes can radiate tens of Watts of peak laser power.

The hatched rectangular areas shown in FIG. 1 provide a misleading representation of the relative dimensions of the emitter front facets because their extent along the vertical Y axis does not exceed about 1 μm. As a result, the front facet of each laser diode emitter has the shape of a very thin line elongated along the X axis. It is well known that an optical field of wavelength λ escaping from an aperture having one of its transverse dimensions that compares to λ will suffer from sizable optical diffraction effects along this dimension. Depending on its material composition, the emission wavelength of a laser diode bar ranges typically from about 0.8 μm to 1.5 μm. The optical diffraction effects cause the output laser beamlet to diverge appreciably along the vertical Y axis as soon as it escapes from the emitter front facet. As indicated in FIG. 1, the full divergence angle $\theta_\perp$ of a laser beamlet typically reaches 80° along the Y axis. Unfortunately, the linear array of highly-divergent beamlets radiated as a whole by a laser diode bar is totally useless for many applications (including illumination) unless it is passed through suitable beam conditioning optics having a high numerical aperture along the Y axis. Optics with high numerical aperture are often qualified as being fast, so that the vertical Y axis in FIG. 1 is generally referred to as the fast axis of a laser diode bar. In contrast, the large emitter width W relative to the emission wavelength λ results in a much smaller beam divergence angle $\theta_\parallel$ along the X axis, which is on the order of 10° for each individual beamlet. This means that optics with lower numerical aperture (slower optics) can be used for optical conditioning of the beamlets along the X axis. As a consequence, the X axis in FIG. 1 is generally referred to as the slow axis of a laser diode bar.

The structural characteristics of laser diode bars along with the quite different beam divergence angles along the fast and slow axes make any optical transformation of the plurality of raw laser beamlets a real challenge, particularly when the laser illumination output beam must meet stringent requirements. This challenge is better appreciated by pointing out the strong asymmetry between the spatial quality of the laser beamlets along both axes. The spatial quality of a laser beam can be conveniently quantified by the so-called beam parameter product (BPP). This parameter is given by the product of the minimum beam size (beam waist) measured along a given transverse direction with the beam divergence angle measured along the same direction. For example, the plurality of beamlets (taken as a whole) radiated by a typical laser diode bar has a $BPP_F$ of about 0.001 mm×1400 mrad=1.4 mm-mrad along the fast axis, while its counterpart $BPP_S$ along the slow axis reaches about 10 mm×175 mrad=1750 mm-mrad. Despite of the sizable beam divergence angle along the Y axis, the low $BPP_F$ along this axis indicates that the laser beamlets have a very high quality, which approaches that of an ideal Gaussian beam. Stated otherwise, the laser beamlets are nearly diffraction-limited along the fast axis. In turn, the spatial quality of the whole set of laser beamlets along the slow axis degrades dramatically according to the $BPP_S$ value that gets higher by nearly three orders of magnitude. The degraded beam quality along the slow axis comes, in one hand, from the laser emission that is formed of a set of individual laser beamlets that escape from emission apertures well spaced from each other and spread along a segment of 10-mm long. On the other hand, the intrinsic spatial quality of each individual beamlet along the slow axis is much lower than along the fast axis. This is due to the relatively large width W of each laser diode emitter (50 μm to 200 μm, as noted earlier), which favors laser oscillation on several higher-order lateral modes having intricate transverse irradiance profiles.

Note that the product of the BPP values along both fast and slow axes gives an optical beam metric having the units of area×solid angle, and it shares several features with the concept of étendue commonly used in the design of optical illumination systems.

The optical conditioning of a plurality of highly-divergent laser beamlets having asymmetric cross-sectional areas along the orthogonal fast and slow axes has been tackled with various approaches, one of them being illustrated in the schematic perspective view of FIG. 2 (PRIOR ART). Note that the expression "optical beam conditioning" is defined herewith as the transformation of the spatial characteristics of a laser beam (or a set of laser beamlets) using appropriate optics in order to fulfill specific requirements. For instance, this expression encompasses the collimation of a laser beam, which is an optical transformation that specifically aims at minimizing the divergence angle of the beam by increasing its minimum transverse beam size. FIG. 2 shows a laser diode system formed of a laser diode bar 10 comprising five emitters (depicted by the filled areas) and of beam conditioning optics 12. This optics includes a cylindrical microlens 14 placed close to the front facet of the laser diode bar 10 and dedicated micro-optics 16. The use of a single cylindrical microlens 14 to collimate the whole set of beamlets along the fast axis is well known in the art and disclosed in U.S. Pat. Nos. 4,785,459 to Baer (step-index optical fiber), 5,081,639 to Snyder et al., (aspheric microlens) and 5,825,803 to Labranche et al., (graded-index (GRIN) microlens). This technique can reduce the beam divergence angle to less than 1° along the fast axis while achieving optical throughputs of about 90%, so that less than 10% of the incident optical power is lost through the fast-axis collimation step.

The function of the micro-optics 16 can be imagined as a rotation by 90° of the fast-axis and slow-axis divergence angles of each beamlet that impinges on its input facet. Various designs for the micro-optics 16 have been disclosed in prior art patents, such as in U.S. Pat. Nos. 5,168,401 to Endriz, 5,513,201 to Yamaguchi et al., 6,324,190 to Du et al., and in 6,870,682 to Grenier et al., all of these inventions relating to reflective micro-optics. In turn, designs based on refractive micro-optics are disclosed in U.S. Pat. Nos. 5,513, 201 to Yamaguchi et al., 6,639,727 to Kusuyama, and in 6,471,372 to Lissotschenko et al. The effect of the rotation of the individual beamlets by 90° about their propagation axis Z is depicted in FIG. 2 by the sets of hatched rectangular areas enclosed in two separate boxes, one of them 18 pertaining to the beamlets incident on the micro-optics 16 while the other 20 pertains to those leaving it. The micro-optics 16 is often referred to as a beam symmetrization device because its action results in a set of output beamlets that have their beam parameter products $BPP_F$ and $BPP_S$ closer to each other, as compared to the original pair of BPP factors, prior to optical beam conditioning. Beam symmetrization devices are available with optical throughputs that can reach 90% when used with laser diode bars with fill factors of about 20% to 50%. In addition, some beam symmetrization devices are packaged with a fast-axis collimation microlens 14, so that the optical conditioning of the whole set of laser beamlets can be realized with a single component.

The beam symmetrization devices disclosed in the various patents cited in the preceding paragraph are not well suited for use with laser diode bars having high fill factors because the incoming beamlets must be sufficiently spaced from each other to minimize truncation of their irradiance distributions upon entering into the device. A refractive-type beam symmetrization device that reduces truncation of the incoming beamlets is disclosed in U.S. Pat. No. 7,260,131 to Grenier et al. Both input and output surfaces of this device have curved profiles and properly-shaped contours that better match the irradiance distributions of the incoming beamlets. The device allows for emission of a set of conditioned beamlets with increased radiance (or brightness) since the gap between consecutive beamlets in the output plane of the device is minimized, if not totally eliminated. Accordingly, a beam symmetrization device that allows sizable reduction of the full cross-sectional area of the beamlets is disclosed in U.S. Pat. No. 7,027,228 to Mikhailov. The narrower beam irradiance distribution at the output of the device promotes better focusing of the beam power on the input face of an optical fiber.

Some highly-demanding illumination tasks call for optical output powers that largely exceed what a laser illuminator a made up of a single laser diode bar can deliver when driven at its maximum current rating. A way to promote higher output powers consists in integrating a plurality of laser diode bars in the laser illuminator assembly and to couple optically their individual laser emissions. The quest for powerful laser illuminator devices then lends itself to the use of stacked laser diode arrays (SLDAs), which are built by stacking several identical laser diode bars in a monolithic package. By way of example, FIG. 3 (PRIOR ART) shows a schematic front view of a SLDA made up of five laser diode bars depicted by the gray-shaded areas. Each laser diode bar comprises ten emitters, having their front facets depicted by the rectangular areas filled in black. The laser diode bars can be stacked one above the other according to a suitable packaging architecture to give a two-dimensional laser diode array, which would comprise a total of 50 laser emitters for the specific example depicted in FIG. 3. The packaging architecture serves to hold the laser bars firmly in place while ensuring proper electrical biasing and cooling of each bar. The radiated total output power scales directly with the number of stacked laser diode bars. Some packaging architectures allow the vertical spacing P between consecutive laser diode bars, denoted as the array pitch, to be as low as 0.4 mm.

Two packaging architectures are widely used for mounting laser diode bars in SLDAs. The first architecture encompasses the numerous variations of the Rack-and-Stack technique, in which the laser diode bars are first mounted on individual submounts or heatsink assemblies that are then stacked. SLDAs packaged according to this architecture are disclosed in U.S. Pat. Nos. 4,716,568 to Scifres et al., 4,719,631 to Conaway, 5,099,488 to Ahrabi et al., 5,305,344 to Patel, 5,311,530 to Wagner et al., 5,715,264 to Patel et al. and in 5,764,675 to Juhala. The other packaging architecture is based on the Bars-in-Grooves technique, in which the laser diode bars are inserted into parallel grooves machined with high precision in a substrate made of a material having high thermal conductance. The bars are soldered to the side walls of the grooves, thus resulting in very rugged, monolithic assemblies. This packaging architecture is disclosed in U.S. Pat. Nos. 5,040,187, 5,128,951, 5,284,790, and 5,311,535, all to Karpinski.

The beam conditioning optics discussed in the preceding paragraphs serves for optical transformation of the plurality of beamlets radiated by a single laser diode bar. As a consequence, they cannot be used as is for conditioning the laser emission from a SLDA, which takes the form of a two-dimensional array of beamlets having different spacings along the orthogonal fast and slow axes. Obviously, one may think of stacking several beam conditioning components along the vertical direction in nearly the same way as for the diode laser bars, and then placing the whole assembly in front of the SLDA to perform a collective transformation of the beamlets.

Unfortunately, this approach often leads to disappointing results, due to factors such as mismatches between the vertical pitches of the SLDA and of the beam conditioning stack, the overall height of the beam conditioning components that exceeds the array pitch, variations of the array pitch along the whole stack, and possible vertical misalignment of the laser emitters belonging to the same vertical column in the stack. Stated otherwise, the optical registration of the beam conditioning components with the individual laser emitters in the SLDA calls for tight manufacturing and mounting tolerances. The short focal lengths required for conditioning beamlets having strong divergence angles along both fast and slow axes amplify the detrimental effects of the factors mentioned above. These factors act together in degrading the overall throughput of the beam conditioning stack while giving a final output laser beam with spatial characteristics that, most of the time, do not fulfill the stringent requirements of several laser illumination applications.

SUMMARY OF THE INVENTION

In accordance with a first aspect of the invention, there is provided a laser diode illuminator including a plurality of high-power laser diode bars packaged in the form of a SLDA assembly, the number of stacked laser diode bars being sufficient to radiate the desired maximum laser output power. The two-dimensional array of laser beamlets emitted from the SLDA assembly is optically conditioned by two separate arrays of optical components acting in cascade. The first array of optical components consists in a plurality of refractive micro-optics devices. An individual micro-optics device is optically registered to the linear array of laser beamlets emitted from each laser diode bar packaged in the SLDA assembly. Each micro-optics device achieves two distinct functions, which are firstly the collimation of the beamlets along the fast axis of the laser diode bars, and secondly the interchange (also denoted as a 90°-rotation) of the divergences of each beamlet along the orthogonal fast and slow axes. The second array of optical components consists in a plurality of cylindrical microlenses having appropriate focal lengths for collimation along the slow axis of the beamlets exiting from the micro-optics devices. The array of slow-axis microlenses is held in place using a support structure to which the microlenses are bonded. This scheme for optical conditioning a two-dimensional array of laser beamlets allows for more efficient use of the total light power radiated by a SLDA assembly by promoting higher optical thoughputs. In addition, laser diode illuminators can be made more compact than similar devices of the prior art that make use of bulk lensing for collimation of the beamlets.

In accordance with a second aspect of the invention, there is provided a method for generating a laser beam suitable for use in light illumination applications. The first step of the method is to provide a SLDA assembly made up of a plurality of laser diode bars, wherein the number of laser diode bars is chosen so that the specified maximum output power can be achieved when accounting for the various optical losses. The next step consists in optically registering a first micro-optics device to the linear array of laser beamlets radiated by a first laser diode bar of the SLDA assembly. This first micro-optics device performs collimation along the fast axis and interchange of the fast-axis and slow-axis divergences of the linear array of laser beamlets. Upon completion of the optical registration step, the first micro-optics device is bonded to the SLDA assembly. The procedure is then repeated with additional micro-optics devices for the linear array of beamlets radiated by each laser diode bar packaged in the SLDA assembly. A support structure is then affixed to the SLDA assembly, this support structure having a front face on which cylindrical microlenses will be bonded. The next step is the optical registration of a first cylindrical microlens to a first linear array of laser beamlets exiting from a first micro-optics device. The first cylindrical microlens serves for collimation along the slow axis of a first linear array of laser beamlets. The first cylindrical microlens is then bonded to the front face of the support structure, and the optical registration procedure is then repeated for the linear array of laser beamlets exiting from each previously registered micro-optics device. The SLDA assembly optically conditioned the way as summarized in the preceding lines can then be integrated in a laser diode illuminator device to allow the emission of an output laser beam carrying the required optical power while filling a prescribed field of illumination with the desired irradiance uniformity.

These advantages and novel features of the invention will be further appreciated by reference to the detailed description of the preferred embodiments in conjunction with the accompanying drawings.

DESCRIPTION OF PREFERRED EMBODIMENTS OF THE INVENTION

Figure 1:
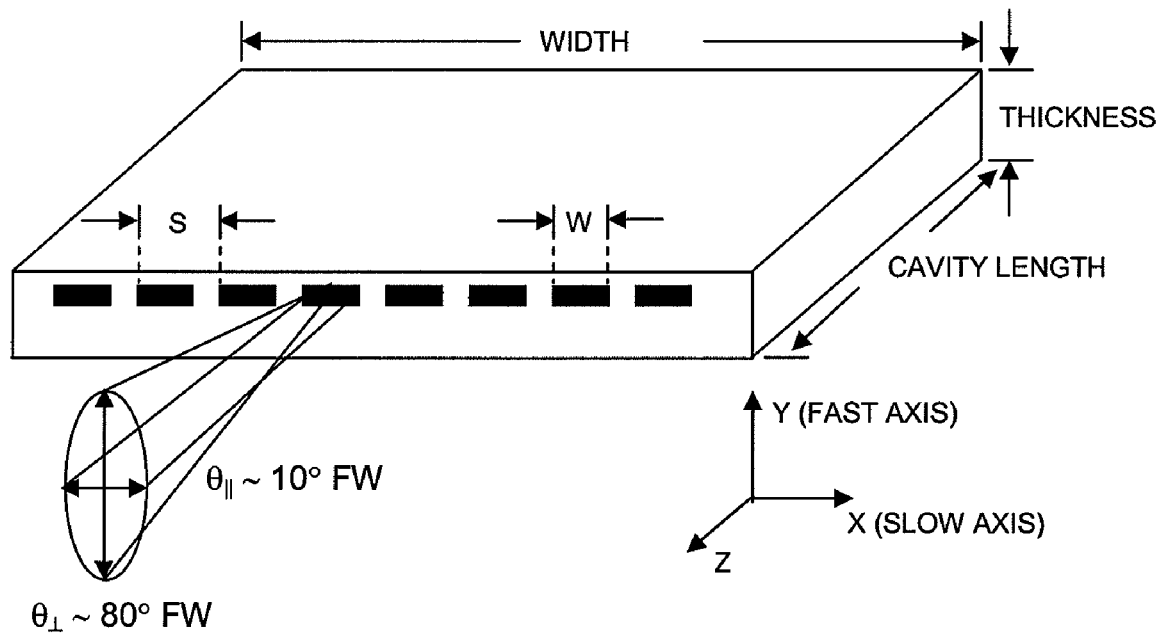
FIG. 1 (PRIOR ART) is a schematic perspective view of a laser diode bar wherein the beam divergence characteristics along both fast and slow axes are also shown.

Reference will now be made in detail to the preferred embodiments of the invention. This invention may, however, be embodied in many different forms and should not be construed as limited to the embodiments set forth in the following description. The structure of a laser diode illuminator device 50 built in accordance with a preferred embodiment of the present invention can be better understood by referring to the schematic block diagram shown in FIG. 4. Note that each identical or nearly identical component that is illustrated in the various figures is represented by a like reference numeral. The core of the laser illuminator device 50 is a SLDA assembly 52 in which the number N of stacked laser diode bars is large enough to fulfill any specified laser output power requirement when the SLDA assembly 52 is driven at its nominal current rating. In practice, the N laser diode bars need not be stacked all in the same array, since the SLDA assembly 52 can be avantageously include a number of separate SLDAs disposed side by side in the same transverse plane and driven separately. This mounting scheme may favor a laser emission 54 having a more symmetrical cross-sectional area at the output of the laser illuminator device 50, particularly when the number N of laser diode bars gets high. It can be recalled that the width of a SLDA is on the order of the 10-mm standard width of each laser diode bar, while its height can attain several centimeters. The design of the drive electronics 56 can also benefit from this mounting scheme since the drive voltage applied to each SLDA varies according to the number of stacked laser diode bars. Without limiting the scope of the present invention, it will be assumed from here on that the SLDA assembly 52 comprises a single stack.

Figure 4:
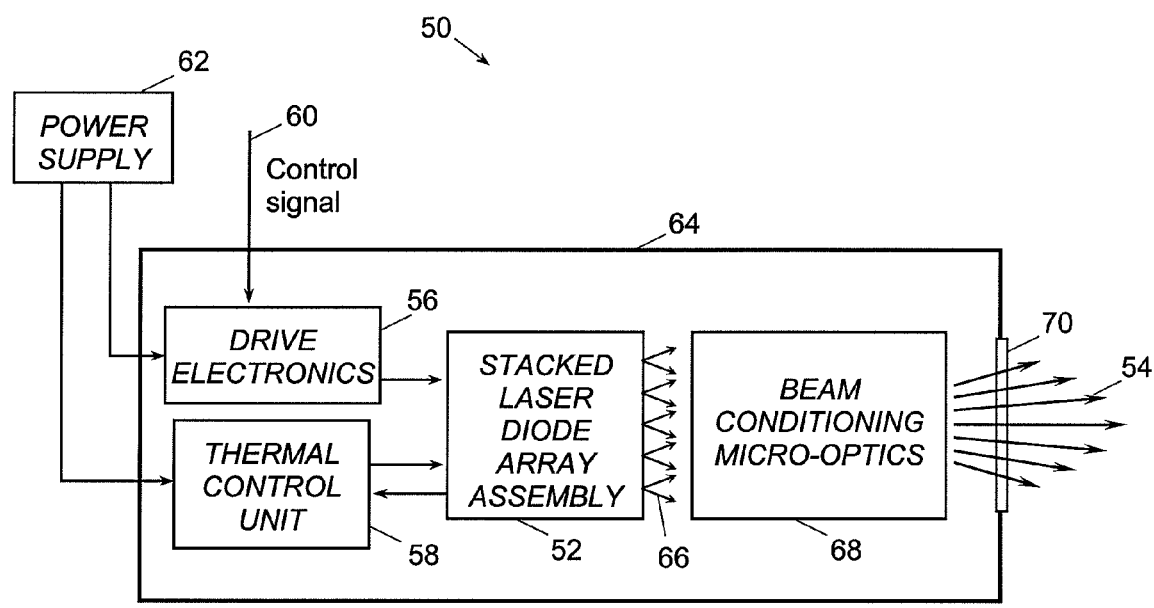
FIG. 4 is a schematic block diagram of a laser diode illuminator device built in accordance with a preferred embodiment of the present invention.

The SLDA assembly 52 includes means for stabilizing its operating temperature, such a thermoelectric cooler device and a heatsink, not shown in FIG. 4. The heatsink can be cooled by natural air convection or through forced air. More sophisticated cooling technologies such as impingement coolers or microchannel coolers can be used for more aggressive cooling, although these technologies are less convenient when integrated in portable laser illuminator devices. A thermal control unit 58 controls the operation of the thermoelectric cooler device to maintain the SLDA assembly 52 within a safe temperature range at every drive level. The drive electronics 56 generates an electrical current waveform for driving the SLDA assembly 52. It is generally commanded by an external control signal 60 when the illuminator 50 is intended to form part of a higher-level system such as an active night-vision imager. In this case, both drive electronics 56 and thermal control unit 58 can be powered by the higher-level system through the external power supply 62. Alternatively, the power supply 62 and the means for controlling the drive electronics 56 can be enclosed with the other components and modules in the housing 64 for convenient operation of the illuminator device 50 as a fully stand-alone unit.

The two-dimensional array of raw laser beamlets 66 emitted by the SLDA assembly 52 is transformed by micro-optics components regrouped as a whole and collectively referred to as beam conditioning micro-optics 68 in FIG. 4. According to an aspect of the present invention, the beam conditioning micro-optics 68 comprises a number of identical micro-optics modules, wherein each module is designed for conditioning the linear array of beamlets emitted by a single laser diode bar. As a consequence, the number of individual micro-optics modules to use is the same as the number N of stacked laser diode bars. The micro-optics modules generally comprise more than a single micro-optics component. Each component is positioned and aligned with care to maximize the overall optical throughput while meeting the other key requirements for the illumination laser beam 54. The beam 54 escapes from the illuminator device 50 after its passage through an optional protection window 70. Anti-reflection coatings tuned at the emission wavelength of the SLDA assembly 52 are generally deposited on the input and output surfaces of each component of the micro-optics modules as well as on both faces of the protection window 70. This precaution helps in keeping the optical reflection losses at a minimum, thus promoting a higher optical throughput.

Figure 2:
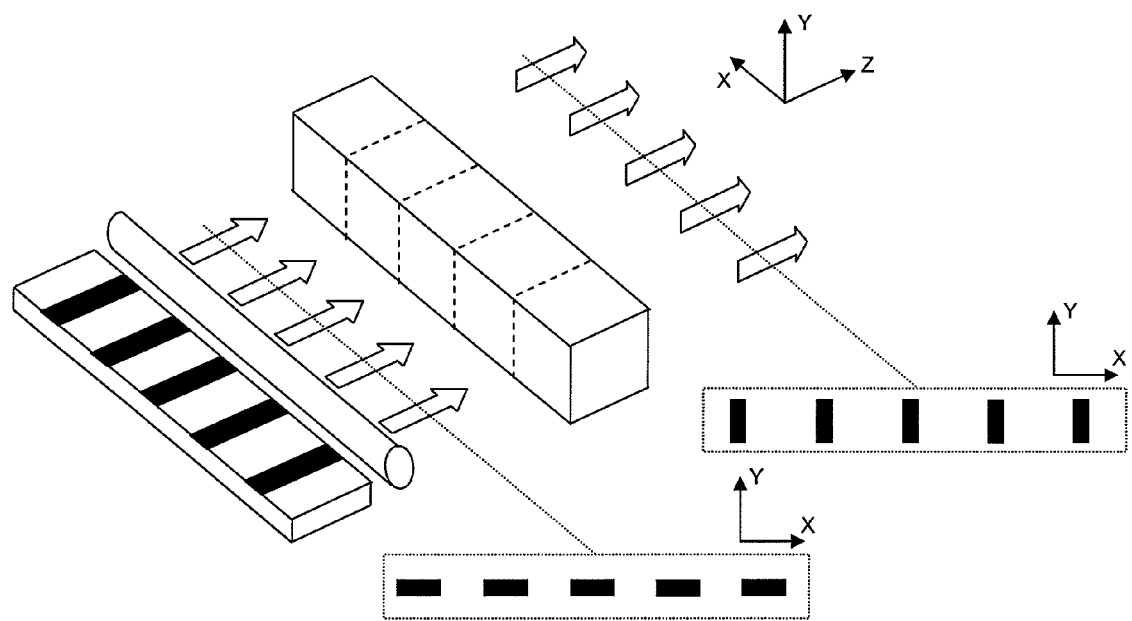
FIG. 2 (PRIOR ART) is a schematic perspective view of a laser diode system comprising a laser diode bar and beam conditioning micro-optics.

According to another aspect of the present invention, the linear array of beamlets emitted by each laser diode bar stacked in the SLDA assembly 52 is conditioned by transmitting it through a micro-optics module made up of a pair of separate micro-optics components. This pair includes a beam symmetrization device 80 followed by a cylindrical microlens 82 for collimation along the slow axis. As explained earlier, the function of the beam symmetrization device 80 can be thought of as rotating (or interchanging) the fast-axis and slow-axis divergence angles of each beamlet by 90° about the propagation axis Z, as illustrated in FIG. 2 wherein the beam symmetrization device has the reference numeral 16. This rotation helps in symmetrizing the spatial beam characteristics (such as the BPP) of the overall laser emission. For convenience, beam symmetrization devices 80 are available with cylindrical microlenses of high numerical aperture integrated in the same package for collimation of the linear array of beamlets along the fast axis. By referring to FIG. 2, this kind of beam symmetrization device could be imagined as a merge of both components 14 and 16 to give a single component 12. A first preferred embodiment of the present invention makes use of such a beam symmetrization device. By way of example, this device can be the BTS-150/500D Beam Transformation System manufactured by LIMO Lissotschenko Mikrooptik GmbH (Dortmund, Germany). This product is designed for use with laser diode bars having 19 laser emitters of 150-μm width and spaced by 500 μm (fill factor of 30%). It comprises a diagonal microlens array that performs the 90° rotation of the whole set of beamlets, while the integrated cylindrical microlens achieves collimation with a residual divergence of less than 8 mrad (0.45° along the fast axis. Another version of this device is intended for optical conditioning of laser diode bars having a fill factor of 50%, which are made up of 24 laser diode emitters of 200-μm width and spaced by 400 μm. Above all, the characteristics of the selected beam symmetrization device 80 must match with the emitter width W and center-to-center spacing S (see FIG. 1) of the laser diode bars.

It can be noted that the passage of the beamlets through the beam symmetrization device 80 lets their divergence angle nearly unchanged along the slow axis. This is the reason why the device 80 must be followed by a cylindrical microlens 82. As indicated in the schematic sketch of FIG. 1, the raw divergence angle of the beamlets along the slow axis is typically on the order of 10°. An angular beam spreading in this range is generally unacceptable in illumination applications that command a narrow field of illumination (FOI) along the direction parallel to the slow axis.

Figure 5:
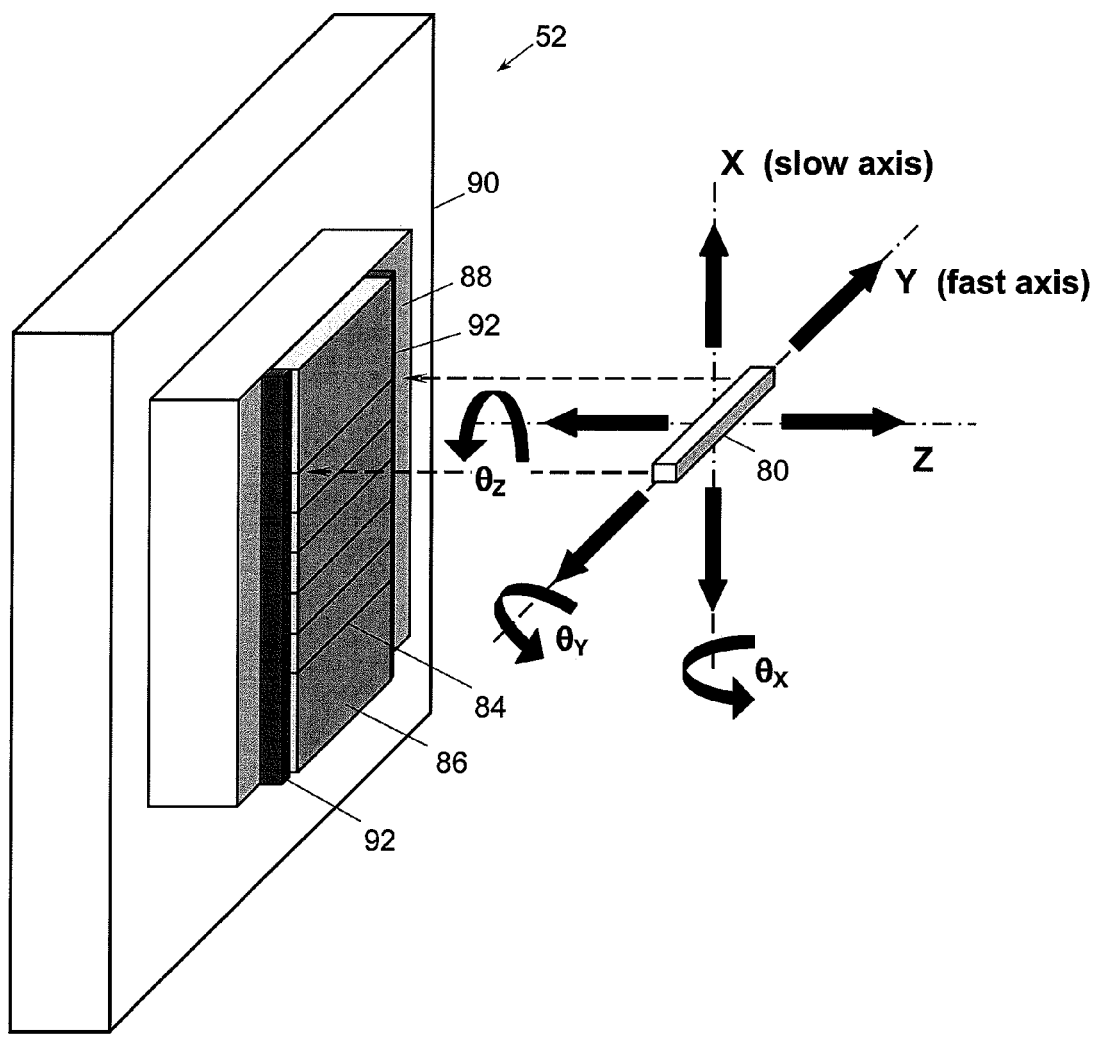
FIG. 5 is a schematic perspective view of a SLDA assembly made up of six laser diode bars to illustrate the optical registration of a first beam symmetrization device to the uppermost laser diode bar of the assembly.

The method for precise optical registration of each beam symmetrization device 80 to a laser diode bar can be better understood by referring to FIG. 5, which shows a schematic perspective view of a SLDA assembly 52 in which six laser diode bars 84 are stacked according to the Bars-in-Grooves array packaging architecture. The laser diode bars 84 are thus inserted in parallel grooves machined in a substrate 86 made from a ceramic material that has a high thermal conductance along with a coefficient of thermal expansion that closely matches that of the semiconductor material of the bars 84. Note that the individual laser emitters of each bar 84 cannot be viewed in FIG. 5, since each bar 84 is sketched as a thin solid line to provide a faithful representation of its actual appearance. The reduced number of laser diode bars 84 packaged in the SLDA assembly 52 and the Bars-in-Grooves packaging architecture are shown in FIG. 5 simply for ease of illustration. Both features should then not be construed as limiting the scope of the present invention. The vertical spacing between consecutive bars (array pitch P, see FIG. 3) must be selected larger than the vertical dimension of the beam symmetrization devices 80 since these devices will be set all in the same plane, at a very close distance from the laser diode bars 84. The substrate 86 is soldered to a heatspreader plate 88 affixed to a mounting baseplate 90. The heatspreader plate 88 and baseplate 90 can be made from a metal having high thermal conductance such as copper, and both elements can be machined as a single piece for better thermal conduction. An elongated thin rod 92 with rectangular or square cross-section is disposed on each side of the substrate 86 and it is bonded to the heatspreader plate 88 using a compatible adhesive. Each rod 92 must be positioned so that its front surface is slightly recessed relative to the front surface level of the substrate 86. The rods can be made from a glass ceramic material such as MACOR®, which allows the machining of very small parts.

As noted earlier, most laser illumination applications call for a tight control of some key illumination parameters such as the laser output power, the FOI, and the uniformity of the radiant intensity within the FOI. Specific illumination requirements can be met via fine optical registrations of each individual pair of beam symmetrization device 80 and slow-axis cylindrical microlens 82 relative to the linear array of beamlets radiated by the corresponding laser diode bar 84. The optical registration procedure can be divided in two main steps performed in sequence: A) registrations of the whole set of beam symmetrization devices 80 for optimization of the illumination characteristics along the fast axis, and B) registrations of the whole set of cylindrical microlenses 82 for optimizing the illumination along the slow axis.

FIG. 5 depicts the optical registration of a first beam symmetrization device 80 to the uppermost laser diode bar 84 of the SLDA assembly 52. For this purpose, the beam symmetrization device 80 is first mounted on a 6-axis micropositionner stage using a dedicated mounting bracket. The micropositionner stage allows precise linear translations of the beam symmetrization device 80 along the three orthogonal axes X, Y, and Z as well as fine tunings of the tilt angles $\theta_x$, $\theta_y$ and $\theta_z$ of the device about the same axes. The mounting bracket must be designed to hold the device 80 while allowing the laser light to pass freely through the device 80 and to escape from it without any obstruction. This design enables continuous monitoring of the far-field radiation pattern of the light escaping from the beam symmetrization devices 80 as the optical registration proceeds. A convenient way to monitor the far-field radiation pattern consists in transmitting the laser light through a bulk converging lens and placing the image sensor of a beam profiler instrument in the focal plane of the lens. The focal length of the converging lens is selected so that most of the beam's far-field radiation pattern falls on the photosensitive surface of the image sensor. For clarity, the micropositionner stage, the mounting bracket, and the set-up for laser beam monitoring have not been illustrated in FIG. 5.

It should be stressed that, as compared to the convention for the axes used up to now (see for example FIG. 3), the slow axis (X) and fast axis (Y) shown in FIG. 5 have been interchanged to account for the 90° rotation of each beamlet caused by its passage through the beam symmetrization device 80.

Figure 6:
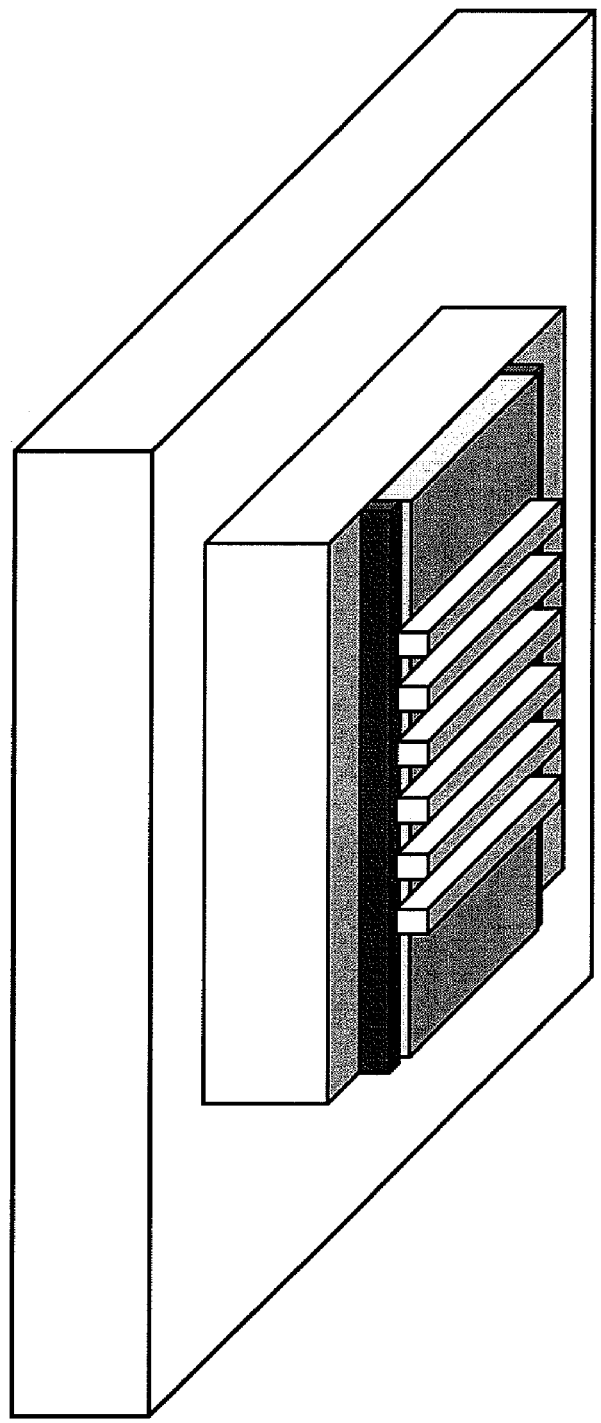
FIG. 6 shows a schematic perspective view of the SLDA assembly of FIG. 5 once the optical registration of each beam symmetrization device is completed.

The optical registration procedure for each beam symmetrization device 80 begins by gently approaching the device 80 very close to the corresponding laser diode bar 84, as depicted by the long-dashed arrows in FIG. 5. The beam symmetrization device 80 must be positioned so that the front facet of the laser diode bar 84 lies approximately in the back focal plane of the fast-axis cylindrical microlens integrated in its assembly (if any). This setting is particularly important when it is desired to get an optimum collimation of the beamlets along the fast axis. The position and tilt angle of the beam symmetrization device 80 along each axis are then fine tuned while monitoring the resulting far-field radiation pattern, following a trial-and-error approach. The fine tuning is stopped when the far-field pattern, as continuously monitored with a beam profiler instrument, gets the desired features. A great deal of attention must be paid to the fine tuning of the horizontal position (i.e., along the fast axis Y in FIG. 5) of the beam symmetrization device 80 since it includes a set of diagonal microlenses that must be in precise registration with the laser diode emitters of the bar 84. The next step then consists in bonding the beam symmetrization device 80 to the SLDA assembly 52 by dropping a little amount of a compatible UV-curing adhesive in the gaps between the surface of the device 80 that faces the laser diode bar 84 and the recessed front surface of both vertical rods 92. Bonding with a low-shrink fiber-optic adhesive such as the OP-66-LS adhesive from Dymax Corp. (Torrington, CT) is preferred to minimize any optical misalignment of the device 80 as the curing proceeds. The device 80 is released from the mounting bracket once the curing is completed. The optical registration procedure as described above is then repeated for each laser diode bar 84 mounted in the SLDA assembly 52. FIG. 6 shows a schematic perspective view of the SLDA assembly 52 of FIG. 5 with a beam symmetrization device 80 now optically registered to each laser diode bar 84. Note that the adhesive used for bonding each device 80 to the rods 92 is not shown in the figure.

As compared to the Bars-in-Grooves technique for stacking the whole set of laser diode bars 84 in a monolithic SLDA assembly 52, mounting the laser diodes bars 84 according to a rack-and-stack technique offers additional flexibility in the procedure for optical registration of the beam symmetrization devices 80. Hence, with the rack-and-stack technique the laser diode bars 84 can be first mounted in their own submount assemblies, which allow individual burn in and performance screening of the laser diode bars prior to stacking them to form a SLDA assembly 52. As a consequence, each beam symmetrization device 80 is optically registered to a laser diode bar 84 mounted in its submount assembly, using the method as described in the preceding lines. The operation and coupling efficiency of a beam symmetrization device 80 coupled to a laser diode bar 84 can then be tested prior to mounting the bar in the SLDA assembly 52.

At the end of the optical registration procedure for the whole set of beam symmetrization devices 80, the resulting far-field radiation pattern along the fast axis will be given by the overlap of the far-field patterns associated to each individual, optically conditionned laser diode bar 84 mounted in the SLDA assembly 52. Laser illuminator devices are often built for illuminating within a specified FOI in which the local radiant intensity (power per unit of solid angle) must be kept as uniform as possible within the FOI. Depending on the specified dimension of the FOI along the fast axis, the uniformity of the radiant intensity could not be as desired if the laser beams escaping from the array of beam symmetrization devices 80 have their far-field radiation patterns all in coincidence within the FOI, i.e., if they perfectly overlap. This situation could occur when each individual far-field pattern is narrower than the extent of the FOI specified along the fast axis. The radiant intensity can be made more uniform by allowing the individual laser beams to point in slightly different directions with respect to each other while slightly enlarging their individual far-field radiation patterns. Stated otherwise, a flatter radiant intensity distribution within the FOI can be obtained by varying the boresighting of each laser beam escaping from a beam symmetrization device 80 while slightly "degrading" its collimation along the fast axis. Further refinements to the technique can be provided to minimize for example the fraction of the total laser beam power that spills past the edges of the specified FOI, while keeping the radiant intensity inside of the FOI as high as possible.

Figure 7:
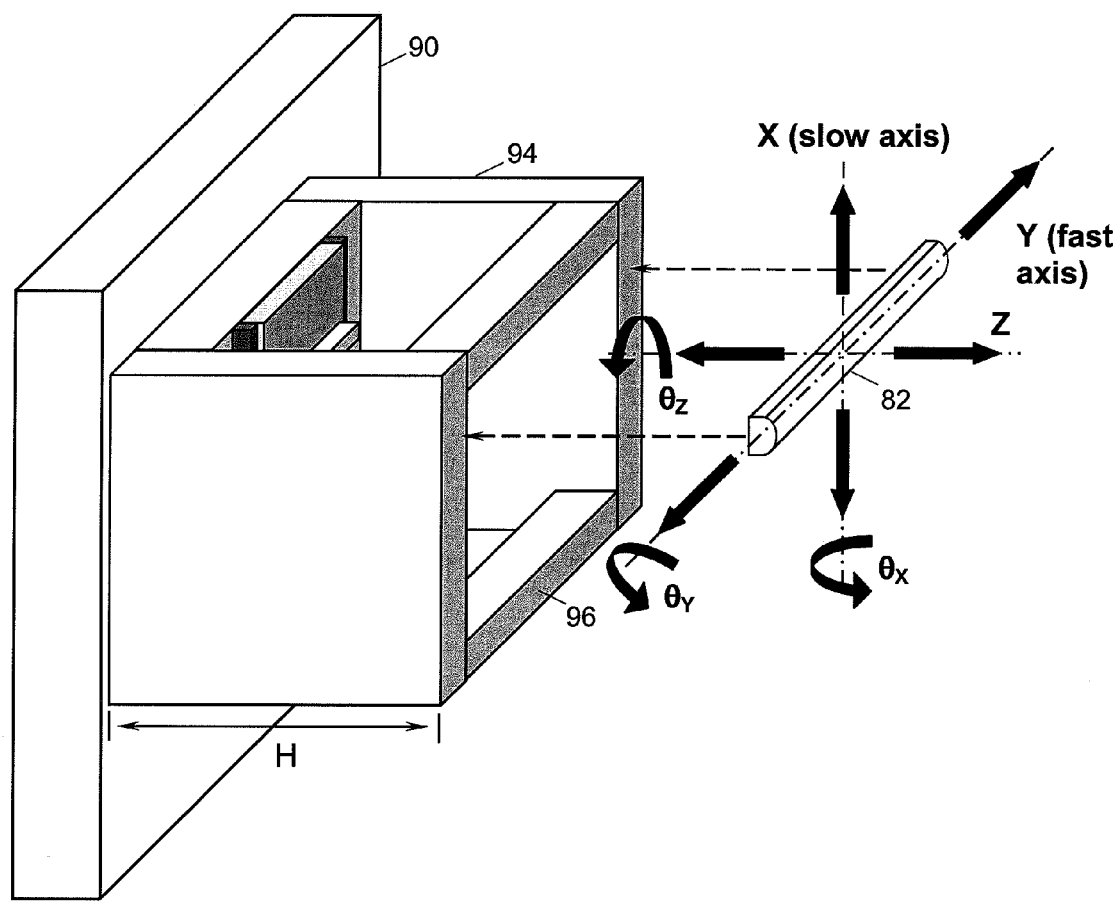
FIG. 7 shows a perspective view of the SLDA assembly of FIG. 6 with a support structure affixed to it to illustrate the optical registration of a first cylindrical microlens for collimation along the slow axis.

The residual divergence angle of the linear array of laser beamlets escaping from each individual beam symmetrization device 80 shown in FIG. 6 can be as low as a few mrad along the fast axis, owing to the action of the fast-axis cylindrical microlens integrated in the device 80. On the other hand, the far-field radiation pattern along the slow axis can be too wide for the intended laser illumination application. This means that, most of the time, optical beam conditioning will be needed along the slow axis as well, using an array of cylindrical microlenses 82 with suitable characteristics. Similarly to FIG. 5 for the beam symmetrization devices 80, FIG. 7 depicts a perspective view that illustrates the optical registration procedure for each slow-axis cylindrical microlens 82. The figure shows a cylindrical microlens 82 whose cross-section has a plano-convex shape, but it should be understood that this lens design is by no means a limitation of the scope of the present invention. For instance, the cross-section of the microlens 82 could be aspheric. Microlenses 82 with perfectly circular cross-sections are generally ruled out for optical conditioning along the slow axis because their focal lengths are too short.

Prior to starting the optical registration procedure, a dedicated support structure (bridge) 94 must be attached to the SLDA assembly 52 because the spacing between the cylindrical microlens 82 and the exit surface of its corresponding beam symmetrization device 80 can reach 20 mm or even higher, depending on the focal length of the microlens 82. The bridge 94 can be secured to the baseplate 90 of the SLDA assembly 52 with screws or with a suitable adhesive, and it can be made from various materials like aluminum, copper or a glass ceramic material. The height H of the bridge 94 must be selected so that the slow-axis beam divergence angle after transmission through the cylindrical microlens 82 gets minimum as the microlens 82 is set very close to the front surface 96 of the bridge 94. The front surface 96 of the bridge 94 surrounds a rectangular opening that allows the laser beamlets escaping from the beam symmetrization devices 80 to propagate freely up to the input faces of the cylindrical microlenses 82 that will be bonded to the front surface 96. Various designs for the bridge 94 can be contemplated without departing from the scope of the present invention.

The optical registration procedure for each cylindrical microlens 82 is basically the same as the procedure described in the preceding paragraphs for the beam symmetrization devices 80, so that its main steps will not be repeated here. Once the desired characteristics for the far-field radiation pattern along the slow axis are obtained, both end regions of the cylindrical microlens 82 are bonded to the front surface 96 of the bridge 94 using the same low-shrink UV curing adhesive as used previously for bonding the devices 80 to the rods 92. The optical registration procedure is then repeated for the other laser diode bars 84. As a result, the number of cylindrical microlenses 82 to register is the same as the number of laser diode bars 84 stacked in the SLDA assembly 52. It can be noted that the number of cylindrical microlenses 82 and their spacings do not depend on the characteristics of the laser emitters grown on each laser diode bar 84. This is a major aspect of the present invention since laser diode bars having a lot of laser emitters (i.e., more than 19) and/or having fill factors above 30% can be optically conditioned along the slow axis without major difficulty, to get a resulting far-field radiation pattern that is much more symmetrical with respect to the orthogonal fast and slow axes. In addition, the beamlets escaping from the beam symmetrization devices 80 can propagate over a longer distance before starting to overlap with their neighbors. The present invention largely benefits from this feature sine it allows for the use of slow-axis cylindrical microlenses 82 having longer focal lengths. The residual divergence angle of the output laser beamlets along the slow axis is substantially given by the ratio W/fs, where W is the width of each individual laser emitter (see FIG. 1) and fs is the focal length of the slow-axis microlenses 82. With the method of the present invention, the laser beamlets can propagate over distances of about 20 mm before noticeable overlap, so that the cylindrical microlenses 82 with a focal length of 20 mm can be used to provide residual beam divergence angles on the order of 7.5 mrad ($\approx 0.42°$) along the slow axis, assuming 150-µm-wide laser emitters. This is more than a twofold improvement when comparing with the best results obtained from the traditional optical conditioning techniques based on the optical registration of two separate arrays of cylindrical microlenses.

Figure 3:
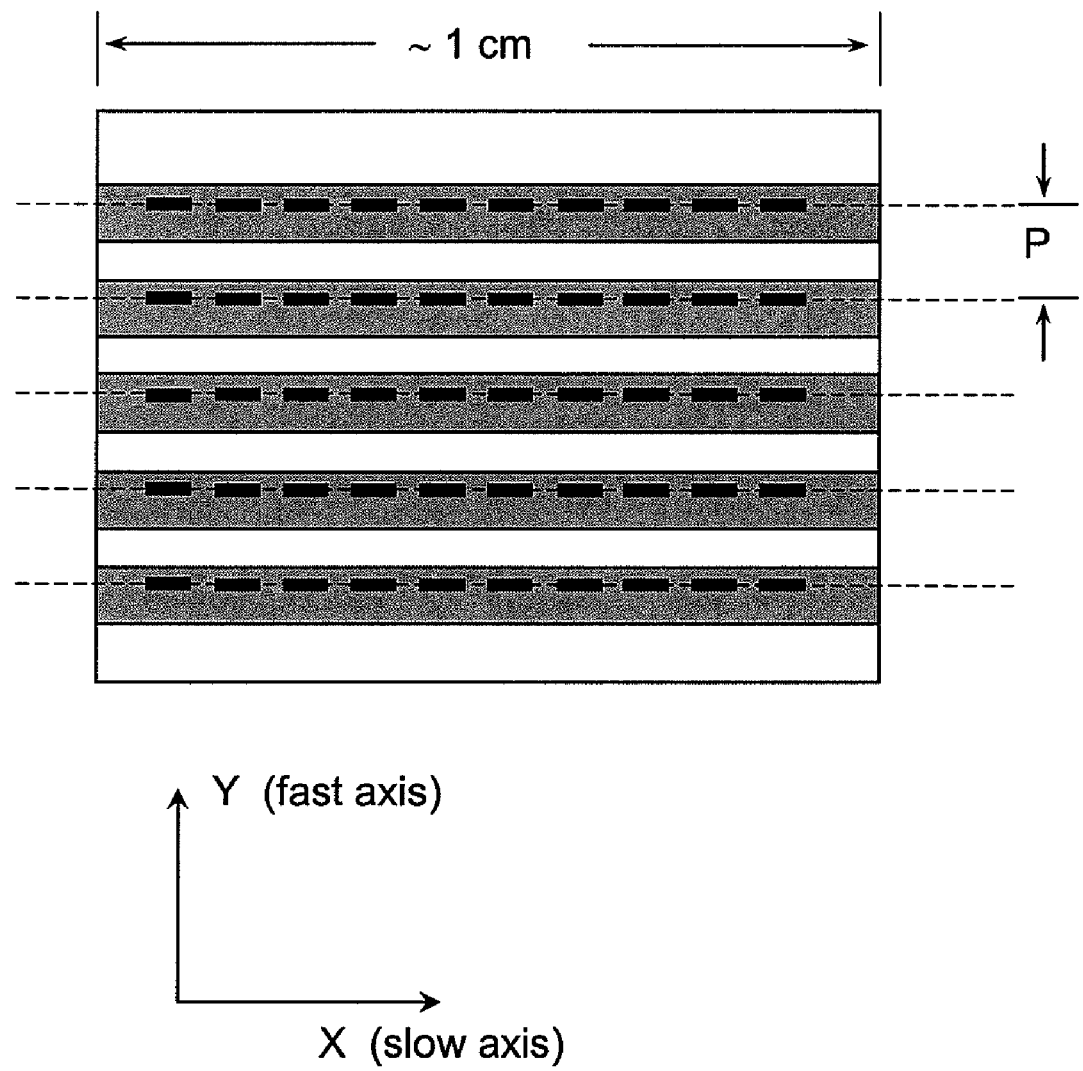
FIG. 3 (PRIOR ART) is a schematic front view of a stacked laser diode array comprising five laser diode bars, depicted by the gray-shaded areas. The small filled rectangles give the positions of the individual laser emitters in each laser diode bar.
Figure 8:
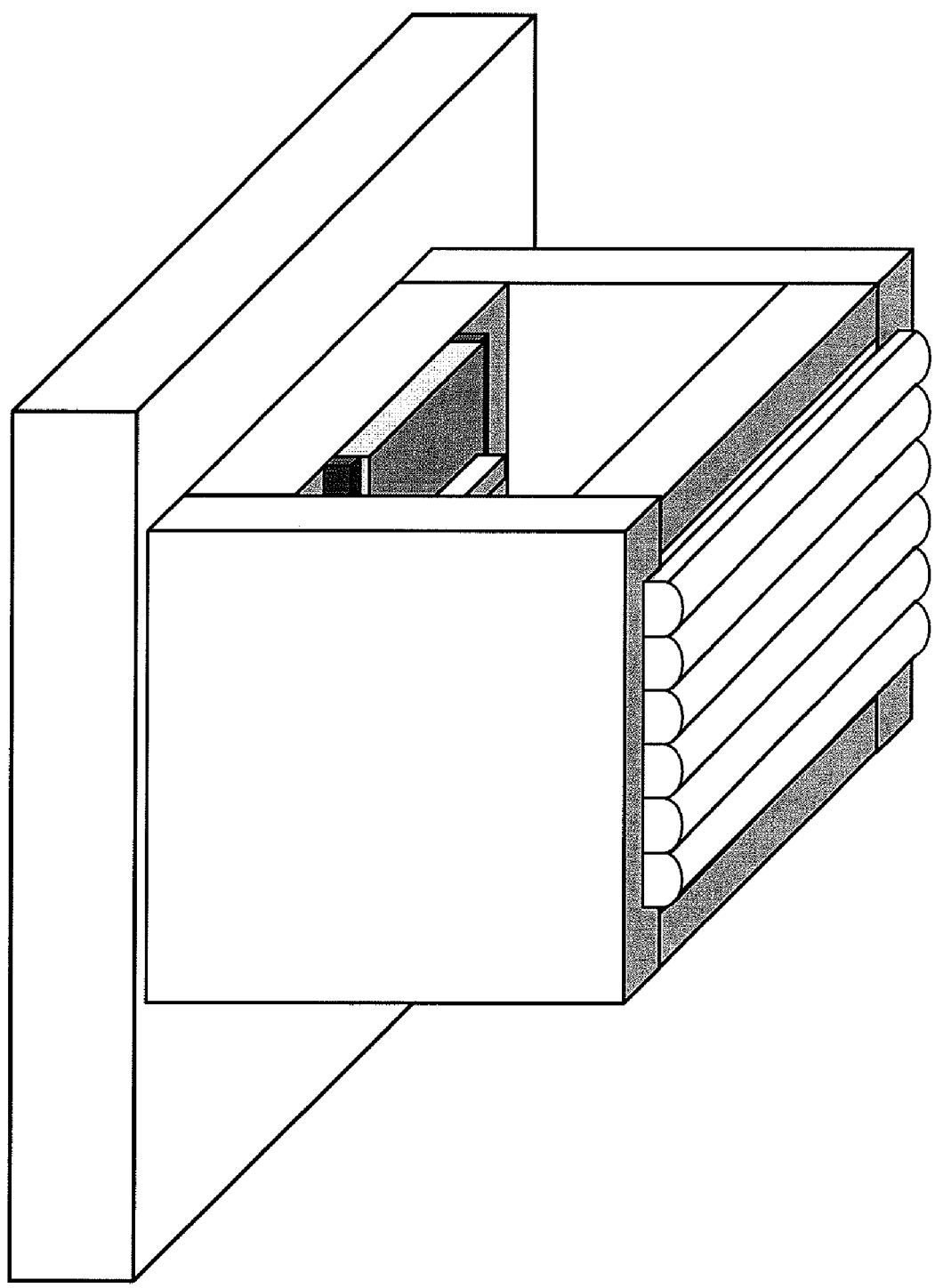
FIG. 8 is a perspective view of the SDLA assembly shown in FIG. 7 once the optical registration of the whole set of slow-axis cylindrical microlenses is completed.

FIG. 8 is a perspective view showing the array of six cylindrical microlenses 82 affixed to the bridge 94. Each laser diode bar 84 of the SLDA assembly 52 now has its whole set of laser beamlets conditioned along both fast and slow axes. FIG. 8 shows another major aspect of the present invention, in that the cylindrical microlenses 82 are now oriented along a direction parallel to the laser diode bars 84. This aspect means that the spacing between consecutive microlenses 82 corresponds to the pitch P of the SLDA assembly 52. The assembly 52 can then be manufactured with a pitch P selected in accordance with the vertical dimension of the beam symmetrization devices 80 to be used and with the spacing desired between consecutive cylindrical microlenses 82. For instance, selecting a larger pitch P allows for use of cylindrical microlenses 82 of larger diameter, thus favoring a better control of the optical aberrations as well as making the manufacturing and registration of the microlenses a bit easier. Furthermore, the orientation of the microlenses 82 parallel to the laser diode bars 84 also means that there is no need to ensure precise horizontal alignment of the laser diode bars 84 in order to get the laser emitters registered in the form of a series of straight vertical columns, as illustrated in FIG. 3. The tolerances related to the packaging of each laser diode bars 84 into the SLDA assembly 52 can then be relaxed. This latter advantage gets more important by recalling that the SLDA assembly 52 is the primary cost driver of high-power laser diode illuminator devices.

One skilled in the art would find that the use of an array of cylindrical microlenses 82 for collimating the beamlets along the slow axis is not absolutely required since the whole array could have been replaced by a single bulk cylindrical lens with its curvature aligned along the slow axis. Using a single bulk lens gives a laser illuminator with a slightly reduced part count while accelerating its manufacturing process. However, this design strategy does not allow for individual fine tuning of the far-field radiation pattern associated to each laser diode bar. As a result, it could be harder to meet any existing specification requirement relating to the shape or to the extent of the far-field radiation pattern along the slow axis. In addition, the focal length of each cylindrical microlens 82 is much shorter than that of a bulk cylindrical lens, because the latter must have its transverse size large enough to collect the whole set of beamlets radiated by the SLDA assembly 52. The difference in focal lengths gets more dramatic as the number of laser diode bars 84 stacked in the assembly 52 increases. The use of an array of cylindrical microlenses 82 then lends itself to more compact laser illuminator devices.

While the preferred embodiments of the invention in their various aspects have been described above, such descriptions are to be taken as illustrative of embodiments of the invention rather than descriptions of the intended scope of the invention.

The invention claimed is:

1. A laser diode apparatus for illumination, said apparatus comprising:
   (a) a plurality of laser diode bars packaged in the form of at least one stacked laser diode array, said at least one array radiating a two-dimensional array of laser beamlets,
   (b) a plurality of micro-optics devices for perfoming collimation of the beamlets along the fast axis of said laser diode bars and for interchanging divergence angles of said beamlets along the orthogonal fast and slow axes, the number of said micro-optics devices being equal to the number of said laser diode bars,
   (c) a plurality of cylindrical microlenses elongated along a direction parallel to said diode laser bars for performing collimation along the slow axis of the beamlets exiting from said micro-optics devices, the number of said cylindrical microlenses being equal to the number of said laser diode bars and their spacing being equal to the spacing between said diode laser bars, and their maximum diameter being determined by the spacing between said laser diode bars,
   (d) a support structure having a front face on which said plurality of cylindrical microlenses are bonded, said support structure being attached to said array of laser diode bars and said support structure securing said plurality of cylindrical microlenses, said support structure providing spacing between said plurality of cylindrical microlenses and said array of laser diode bars so that the plane of emission of said array of laser diode bars is substantially in the back focal plane of said cylindrical microlenses,
   (e) means for supplying electrical power to said at least one stacked laser diode array and for controlling its operation,
   (f) means for controlling the operating temperature of said at least one stacked laser diode array,
   wherein the interchange of the divergence angles of said array of laser beamlets performed by said plurality of micro-optics devices provides for the use of cylindrical microlenses having their focal length long enough to provide collimation with a predetermined residual divergence angle along the slow axis of said array of laser beamlets.

2. The apparatus of claim 1, wherein each of said micro-optics device is formed of a cylindrical microlens having high numerical aperture followed by a refractive micro-optics element for interchanging the divergence angles of said incoming laser beamlets along the fast and slow axes, said cylindrical microlens with high numerical aperture being used for collimation along the fast axis of a linear array of laser beamlets.

3. The apparatus of claim 2, wherein said high-numerical-aperture cylindrical microlens and said micro-optics element are integrated in the same subassembly.

4. The apparatus of claim 2, wherein said high-numerical-aperture cylindrical microlens and said micro-optics element are mounted as separate components.

5. A method for generating a laser beam for use in light illumination applications, comprising the steps of:
   (a) providing a stacked laser diode array comprising a plurality of laser diode bars, the number of said laser diode bars being selected so that a predetermined output power can be radiated,
   (b) optically registering a first micro-optics device to the linear array of laser beamlets radiated by a first laser diode bar of said stacked laser diode array, said micro-optics device performing collimation along the fast axis and interchange of fast-axis and slow-axis divergence angles of said linear array of laser beamlets,
   (c) repeating step (b) for the linear array of laser beamlets radiated by each individual laser diode bar mounted in said stacked laser diode array,
   (d) securing a support structure to said stacked laser diode array, said support structure having a front face,
   (e) optically registering a first cylindrical microlens to a first linear array of laser beamlets exiting from said first micro-optics device, said first cylindrical microlens performing collimation along the slow axis of said first linear array of laser beamlets, said first cylindrical microlens being elongated along a direction parallel to said laser diode bars and said first cylindrical microlens being bonded to said front face of said support structure,
   (f) repeating step (e) for the linear array of laser beamlets exiting from each of said micro-optics devices,
   (g) driving said stacked laser diode array at a drive current selected to get the desired optical output power,
   wherein the combined actions of said micro-optics devices and said cylindrical microlenses enable optical conditioning of the plurality of laser beamlets emitted from said stacked laser diode array to radiate an output laser beam having its radiant intensity profile that fills a predetermined field of illumination with a predetermined uniformity.

6. A method for generating a laser beam for use in light illumination applications, comprising the steps of:
   (a) mounting a first laser diode bar in a submount compatible with a rack-and-stack array packaging architecture,
   (b) optically registering a first micro-optics device to the linear array of laser beamlets radiated by said first laser diode bar mounted in said submount, said micro-optics device performing collimation along the a fast axis and interchange of the fast-axis and slow-axis divergence angles of said linear array of laser beamlets, (c) repeating steps (a) and (b) for a plurality of laser diode bars, the number of laser diode bars being selected so that a predetermined output power can be radiated, (d) packaging the plurality of laser diode bars according to a rack-and-stack array packaging architecture to provide a stacked laser diode array, (e) securing a support structure to said stacked laser diode array, said support structure having a front face, (f) optically registering a first cylindrical microlens to a first linear array of laser beamlets exiting from said first micro-optics device, said first cylindrical microlens performing collimation along the slow axis of said first linear array of laser beamlets, said first cylindrical microlens being elongated along a direction parallel to said laser diode bars and said first cylindrical microlens being bonded to said front face of said support structure, (g) repeating step (f) for the linear array of laser beamlets exiting from each of said micro-optics devices, (h) driving said stacked laser diode array at a drive current selected to get the desired a predetermined optical output power, whereby wherein the combined actions of said micro-optics devices and said cylindrical microlenses enable optical conditioning of the plurality of laser beamlets emitted from said stacked laser diode array to radiate an output laser beam having its radiant intensity profile that fills a predetermined field of illumination with a predetermined uniformity.

7. The apparatus of claim 1, wherein said support structure comprises a material selected from the group consisting of aluminum, copper and glass ceramic.

* * * * *